United States Patent [19]

Parker et al.

[11] Patent Number: 4,801,380

[45] Date of Patent: Jan. 31, 1989

[54] METHOD OF PRODUCING A SILICON FILM WITH MICROPORES

[75] Inventors: Donald L. Parker; Kenneth R. Hall, both of College Station; James C. Holste, Bryan, all of Tex.

[73] Assignee: The Texas A&M University System, College Station, Tex.

[21] Appl. No.: 136,984

[22] Filed: Dec. 23, 1987

[51] Int. Cl.$^4$ ............................................. B01D 13/02
[52] U.S. Cl. ............................... 210/500.21; 264/42; 264/45.6; 264/46.4; 264/DIG. 48
[58] Field of Search ................... 264/41, 42, 44, 45.1, 264/45.5, 45.6, 46.4, 48, DIG. 48, DIG. 62; 210/500.1, 500.21, 500.22, 500.24, 500.25, 500.26, 506

[56] References Cited

U.S. PATENT DOCUMENTS

| | | | |
|---|---|---|---|
| 4,373,399 | 2/1983 | Belogazov et al. | 73/777 |
| 4,380,865 | 4/1983 | Frye et al. | 437/239 |
| 4,419,813 | 12/1983 | Iwai | 437/236 |
| 4,574,263 | 3/1986 | Liddiard | 338/18 |
| 4,592,824 | 6/1986 | Smith et al. | 204/416 |

Primary Examiner—Frank Sever
Attorney, Agent, or Firm—Arnold, White & Durkee

[57] ABSTRACT

The present invention relates to a method of producing micropores having diameters of less than 20 nanometers in straight sides in silicon film. The silicon film produced by this process may be attached to a substrate material and used as a filter in molecular separation processes.

21 Claims, 2 Drawing Sheets

METHOD OF PRODUCING A SILICON FILM WITH MICROPORES

BACKGROUND OF THE INVENTION

1. Field of the Invention

This invention relates to the formation of a microporous silicon film. More particularly, it concerns the controlled anodization and oxidation of silicon to create a porous film. By isolating and mounting the film on a porous substrate, it is possible to effect separation processes in a molecular regime.

2. Brief Description of the Prior Art

Silicon is an abundant element, relatively inexpensive, and commonly used in semiconductors. Refinements in silicon technology have had applications in the computer and integrated circuit industries.

Silicon tends to exist in crystalline form at room temperature. It is well known in the art that a silicon surface may be etched, oxidized, anodized, and bombarded with ions. Advances in silicon processing have concentrated on improved control of surface modification steps, because silicon's good physical properties allow custom-tailoring of its surface contours. For example, the formation of pores has been of particular interest. Pore sizes have decreased substantially over time. With these decreases, the potential uses for silicon have increased.

A variety of silicon methods for making pores are known in the prior art. One process for forming apertures in silicon (Abbas et al.; U.S. Pat. No. 3,962,052) requires the use of photolithographic machinery and materials on both sides of the silicon. The holes produced by this process, however, are no smaller than one micron, a size far above molecular.

A bombardment method disclosed in Price (U.S. Pat. No. 3,303,085) requires a vacuum chamber and a particle beam. There would be great utility and benefit in eliminating the need for such enormous support facilities.

SUMMARY OF THE INVENTION

Porous silicon has been of interest in silicon-on-insulator technology. A porous silicon layer is formed on a silicon wafer, and single crystal silicon islands are then formed on the porous silicon by various techniques. A porous layer is then oxidized to provide dielectric isolation for the silicon islands.

Porous silicon layers have been produced by anodizing crystalline silicon wafers in hydrofluoric acid solutions. During anodization, the wafer has served as the anode, and platinum has served as the cathode.

It has been proposed that laser beams be used to drill small holes in layers of silicon. It has also been proposed that various etching, and bombardment techniques be used for this general purpose. All of these techniques, however, involve complex or expensive procedures.

A continuing need exists for filters capable of separating materials in the molecular regime. Thus, filters with pore sized in the range of 20 to 200 angstroms could be useful in fluid processing applications ranging from hydrocarbon separations to biomedical molecular synthesis. Materials such as zeolites and sintered metals have been used in such service, but these materials suffer from non-uniformity and random flow paths.

The present invention comprises a method for making very fine filters wherein a film of porous silicon is supported on a coarser filter medium, notably sintered metal. The silicon film has pores with diameters of less than about 60 angstroms, in order to effect separations in the molecular regime. Pores as small as about 10–30 angstroms are contemplated, as well as pores which are generally straight and uniform in size.

In a preferred aspect, a monocrystalline or polycrystalline silicon substate is anodized to form a porous silicon film on the substrate. The porous film is then peeled or otherwise removed from the substrate and mounted on a coarser, stronger filter medium. A preferred filter medium is sintered stainless steel, although other sintered metals, ceramics and the like, may be employed depending upon the operating fluids and conditions to be employed. Conveniently, an epoxy resin or cement may be used to attach the porous film to the coarser filter support. The outer periphery of the film will normally be attached in this manner.

It is contemplated that a filter device of the present invention may also be made be depositing a silicon film on a relatively coarse filter support and then anodizing the film in place. Polycrystalline silicon films, for example, may be so deposited using a chemical vapor depositions (CVD) reactor. Dopings of the film may be required.

The pore surfaces of a porous silicon film may be plated, as for example with copper, silver, or other metal. The plating may be conducted following anodization in a liquid electrolyte by transferring the anodized, porous film with electrolyte in the pores from the anodizing cell into a plating cell. When plating copper, the electrical polarity of the cell is reversed from an anode to a cathode.

Once a porous silicon film has been formed, it may be generally desirable to stabilize the film against oxidation if the film is to be used or stored for an extended period. Otherwise, the film may tend to oxide and the pores to close with time. Controlled oxidation may be used to reduce pore size.

A particular feature of the invention is to provide filters with pore sized capable of use in catalysis, hydrocarbon gas separations, artificial organs such as kidneys and lungs, biotechnology, and in the manufacture of pharmaceuticals, food products, chemicals, and the like. Films with pore sizes between about 20 and 60 angstroms are contemplated to be particularly suited for application of the invention.

The mean pore sizes produced in single crystal silicon will depend primarily on the resistivity of the starting material and anodizing current density, and to a lesser degree, on the hydrofluoric acid concentration in the anodizing bath. Doping will normally be required, with less doping for larger pore sizes. Boron has been found to be especially effective as a dopant.

Doping may also be generally desirable in depositing doped polycrystalline or amorphous silicon films on a substrate. Again, boron has appeared to be an effective dopant.

In apparatus form, the present invention comprises a silicon film containing micropores having straight sides attached to a substrate material having pores of larger diameter than the pores in the silicon film. The substrate material may be any material having sufficient structural properties to enhance the strength and rigidity of the silicon film to which it is attached. Graphite and stainless steel are suitable substrate materials. Such an invention may be used as a filter in applications requiring the filtration of particles having molecular dimensions.

DETAILED DESCRIPTION OF THE PREFERRED EMBODIMENTS

Figure 1:
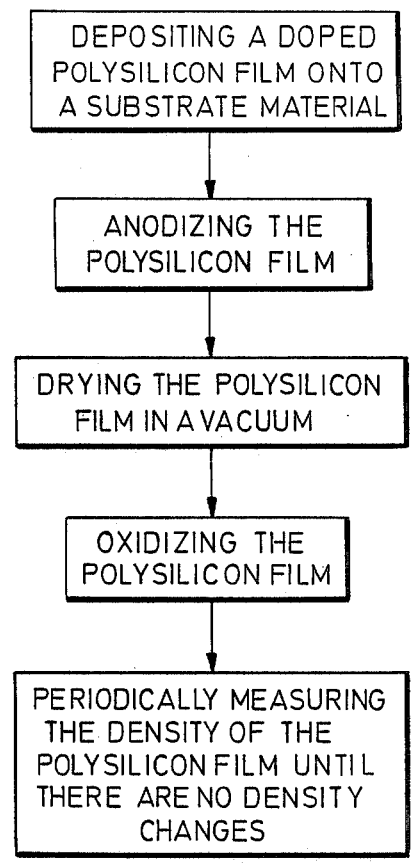
FIG. 1 is a block diagram of a process embodiment of the invention.

A preferred method embodiment of the present invention is depicted in FIG. 1. In this method, a doped polysilicon film 10 is deposited on a porous substrate material 12. the preferred method of depositing the film on the substrate material is by chemical vapor deposition. A number of materials having suitable strength and porosity characteristics can be used as the substrate materials. Sintered stainless steel and porous graphite have been used for this purpose, and a wide range of materials are considered suitable.

After the polysilicon film 10 is deposited on the substrate material 12, it is anodized to produce pores 14 in the film. The film 10 is then dried in a vacuum and may be oxidized to reduce the size of the pores 14 in the polysilicon film 10 to a diameter of less than 60 angstroms. The pores produced by this process have relatively straight sides 18. The length of time required for the oxidation process can be determined by periodically measuring the density of the polysilicon film 10. When the density changes cease, the pore size reduction process has been completed and oxidation may be terminated.

Figure 3:
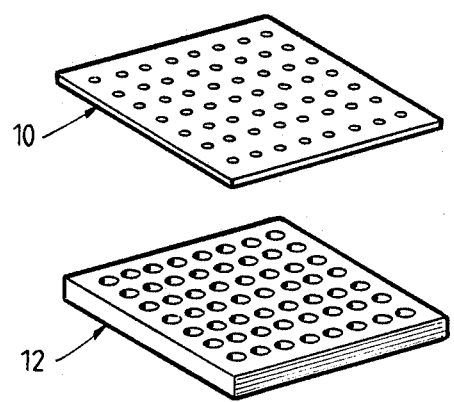
FIG. 3 is an exploded isometric view of an apparatus embodiment of the invention.
Figure 4:
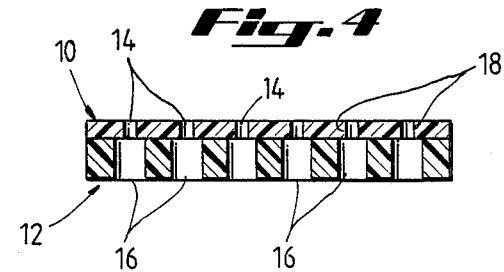
FIG. 4 is a cutaway side view of an apparatus embodiment of the invention.

The polysilicon film 10 and porous substrate structure 12 produced by the above process may be used as a filtering device in molecular separation processes. A preferred apparatus embodiment of the present invention is shown in FIG. 3. The molecular filter is comprised of a porous polysilicon film 10 containing a plurality of pores 14 having diameters less than 60 angstroms and straight sides 18 and a planar substrate material 12 containing a plurality of pores 16 having diameters greater than 60 angstroms. The face of the substrate 12 is bonded to the face of the polysilicon film 10 as shown in FIG. 4.

In preferred embodiments, the substrate material 12 is made from either sintered stainless steel or porous graphite. Any material which (1) is not reactive with the fluid being processed; (2) does not deteriorate in a HF environment; and (3) can withstand CVD temperatures of about 600° C., is suitable as a substrate.

Figure 2:
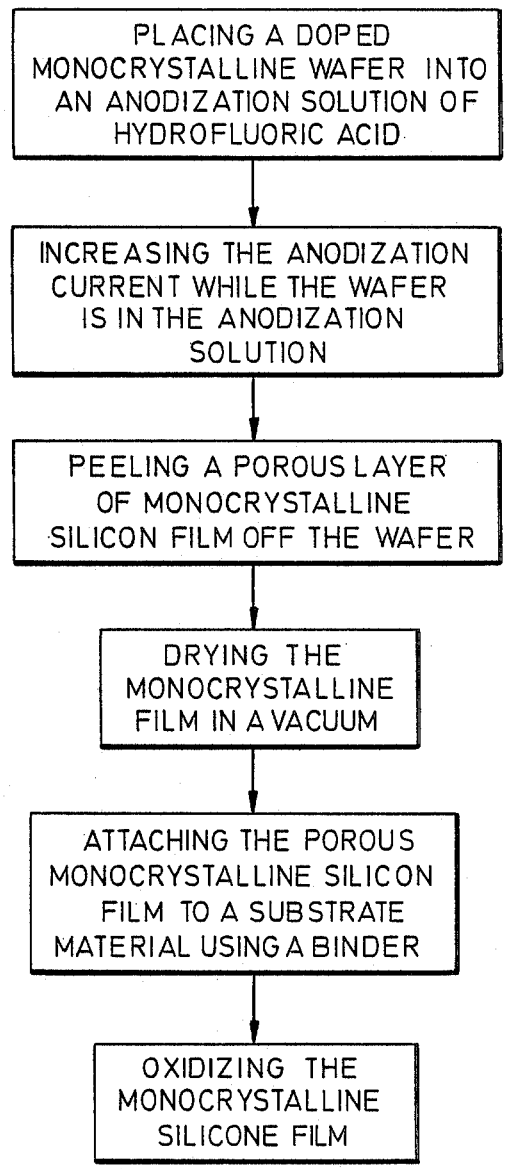
FIG. 2 is a block diagram of another process embodiment of the invention.

Another method embodiment of the present invention is shown in FIG. 2. In this method a doped monocrystalline silicon wafer is placed into an anodization solution in order to produce pores 14 in the monocrystalline silicon. The anodization solution preferably comprises hydrofluoric acid and ethanol. The anodization current is increased while the wafer is in the anodization solution. This increase or ramping up of the anodization current causes a layer of monocrystalline silicon film 10 containing a plurality of pores 14 to separate from the monocrystalline silicon wafer. The porous monocrystalline silicon film 10 is then peeled off the wafer and dried. The thickness of the silicon film 10 is a function of the rate at which the annodization current is increased.

The monocrystalline silicon film is dried in a vacuum and then attached to a porous substrate material 12 using an epoxy cement or other suitable binder. The film is then oxidized at a temperature greater than room temperature in order to reduce the diameter of the pores 14 to less than 20 nanometers. The oxidation time may be reduced by increasing the pressure at which oxidation takes place or by oxidizing in a pure oxygen environment.

An apparatus embodiment of the present invention is a monocrystalline porous silicon film 10 attached to a porous substrate 12 capable of acting as a filter in molecular separation processes. This apparatus preferably comprises a porous monocrystalline silicon film 10 containing a plurality of pores 14 having diameters of less than 60 angstroms and straight sides 18 and a planar substrate material containing a plurality of pores 16 having diameters of greater than 60 angstroms. The face of the substrate 12 is bonded to the face of the monocrystalline silicon film 10.

Many modifications and variations may be made in the embodiments described herein and depicted in the accompanying drawings without departing from the concept of the present invention. Accordingly, it is clearly understood that the embodiments described herein are illustrative only, and are not intended as limitations upon the scope of the present invention.

What is claimed is:

1. A method comprising:
   providing a membrane for separating materials in a molecular regime by,
   (a) anodizing crystalline silicon to form a porous silicon film; and
   (b) securing the porous silicon film on a porous substrate having pores greater in diameter than the pores in the porous film.

2. The method of claim 1 wherein the crystalline silicon is monocrystalline silicon, and the porous silicon film is formed on the surface of the monocrystalline silicon.

3. The method of claim 2, further comprising removing the porous silicon film from the monocrystalline silicon, and transferring the porous silicon film to the porous substrate.

4. The method of claim 1 wherein the crystalline silicon is polycrystalline silicon and the porous silicon film is formed by vapor deposition on the porous substrate.

5. The method of claim 4 further comprising the steps of:
   (a) drying the porous film in a vacuum; and
   (b) oxidizing the porous film at a temperature greater than room temperature to reduce the diameter of the pores.

6. The method of claim 4 wherein the substrate material is graphite.

7. The method of claim 4 wherein the substrate material is stainless steel.

8. The method of claim 1 wherein said anodizing is performed in a solution of hydrofluoric acid.

9. The method of claim 8 wherein said hydrofluoric acid solution comprises ethanol.

10. The method of claim 5 wherein oxidizing takes place at a pressure in excess of atmospheric pressure.

11. The method of claim 5 wherein said oxidizing takes place in a pure oxygen atmosphere.

12. The method of claim 1 wherein the pores produced by oxidation have relatively straight sides.

13. The method of claim 5 further comprising the step of periodically measuring the density of the polysilicon film until there are no density changes.

14. The product made by the method of claim 12.

15. A method comprising the steps of:
providing a membrane for separating materials in a molecular regime by,
(a) placing a doped monocrystalline silicon wafer into an anodization solution to produce pores in the monocrystalline silicon;
(b) increasing the anodization current while the wafer is in the anodization solution;
(c) peeling a porous layer of monocrystalline silicon film off the wafer;
(d) drying the monocrystalline silicon film in a vacuum;
(e) attaching the porous monocrystalline silicon film to a porous substrate material using a binder; and
(f) oxidizing the monocrystalline silicon film at a temperature greater than room temperature to reduce the diameter of the pores to less than 60 angstroms.

16. The method of claim 15 wherein said anodizing is performed in a solution of hydrofluoric acid.

17. The method of claim 16 wherein said hydrofluoric acid solution comprises ethanol.

18. The method of claim 15 wherein said oxidizing takes place at a pressure in excess of atmospheric pressure.

19. The method of claim 15 wherein said oxidizing takes place in a pure oxygen atmosphere.

20. To method of claim 15 wherein the pores produced by oxidation have relatively straight sides.

21. The product made by the method of claim 15.

* * * * *